United States Patent
Rui et al.

(10) Patent No.: US 8,574,985 B2
(45) Date of Patent: *Nov. 5, 2013

(54) METHODS FOR DEPOSITING HIGH-K DIELECTRICS

(75) Inventors: Xiangxin Rui, San Jose, CA (US); Sunil Shanker, Santa Clara, CA (US); Sandra Malhotra, San Jose, CA (US); Imran Hashim, Saratoga, CA (US); Edward Haywood, San Jose, CA (US)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 403 days.

This patent is subject to a terminal disclaimer.

(21) Appl. No.: 13/039,819

(22) Filed: Mar. 3, 2011

(65) Prior Publication Data

US 2011/0151136 A1    Jun. 23, 2011

Related U.S. Application Data

(63) Continuation of application No. 12/495,558, filed on Jun. 30, 2009, now Pat. No. 7,927,947.

(51) Int. Cl.
*H01L 21/8242* (2006.01)

(52) U.S. Cl.
USPC .......... 438/240; 438/680; 438/769; 438/787; 257/E21.006; 257/E21.008; 257/E21.17; 257/E21.267; 257/E21.311; 257/E21.324; 257/E21.645; 257/E21.646

(58) Field of Classification Search
USPC ......... 438/240, 381, 474, 513, 680, 769, 791, 438/787; 257/E21.006, E21.008, E21.077, 257/E21.17, E21.267, E21.311, E21.324, 257/E21.645, E21.646
See application file for complete search history.

(56) References Cited

U.S. PATENT DOCUMENTS

| | | | |
|---|---|---|---|
| 6,787,831 B2 * | 9/2004 | Moon et al. | 257/295 |
| 7,002,788 B2 * | 2/2006 | Jeong et al. | 361/321.5 |
| 7,125,767 B2 * | 10/2006 | Jeong et al. | 438/253 |
| 7,629,608 B2 * | 12/2009 | Honda | 257/43 |
| 7,927,947 B2 * | 4/2011 | Rui et al. | 438/253 |
| 8,278,735 B2 * | 10/2012 | Hashim et al. | 257/532 |

* cited by examiner

*Primary Examiner* — David Nhu

(57) ABSTRACT

Methods for depositing high-K dielectrics are described, including depositing a first electrode on a substrate, wherein the first electrode is chosen from the group consisting of platinum and ruthenium, applying an oxygen plasma treatment to the exposed metal to reduce the contact angle of a surface of the metal, and depositing a titanium oxide layer on the exposed metal using at least one of a chemical vapor deposition process and an atomic layer deposition process, wherein the titanium oxide layer comprises at least a portion rutile titanium oxide.

17 Claims, 8 Drawing Sheets

METHODS FOR DEPOSITING HIGH-K DIELECTRICS

CROSS REFERENCE TO RELATED APPLICATIONS

This is a Continuation Application of U.S. patent application Ser. No. 12/495,558, filed Jun. 30, 2009, now U.S. Pat. No. 7,927,947.

This document relates to the subject matter of a joint research agreement between Intermolecular, Inc. and Elpida Memory, Inc.

FIELD OF THE INVENTION

The present invention relates generally to dielectric materials. More specifically, techniques for depositing high-K dielectrics are described.

BACKGROUND OF THE INVENTION

Semiconductor memories (e.g. dynamic random access memory (DRAM)) can include memory cells that have a capacitor to store charge. The capacitor is typically a metal-insulator-metal (MIM) structure in which the insulator stores the charge for the cell. The state of the memory cell can be changed (e.g. from 0 to 1 or 1 to 0) by charging or discharging the capacitor.

It is desirable to reduce the size of individual memory cells to increase memory density thereby increasing potential memory storage. One way to reduce the size of individual memory cells is to increase the dielectric constant (K) of the insulator materials in the capacitors. A material with a higher dielectric constant can store more charge per unit volume, thereby reducing the amount of material needed to achieve a desired amount of charge.

Several materials have high dielectric constants. For example, titanium oxide potentially has a dielectric constant of over 90. However, different crystal phases of titanium oxide have different dielectric constants, and titanium oxide layers often have dielectric constants much lower than is desirable. Thus, what is needed are techniques for increasing the dielectric constant of deposited layers.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to various embodiments, techniques for forming high-dielectric constant (high-K) dielectric layers are described. The dielectric layer can be used as part of a capacitor for a memory cell, for example. The dielectric layer can be, for example, titanium oxide, which has a relatively higher-K crystal phase (rutile) and a relatively lower-K crystal phase (anatase). The techniques described herein can be used to deposit more rutile relative to the amount of anatase that is deposited. Rutile growth can be encouraged by using an oxygen plasma treatment on the electrode on which the titanium oxide is to be deposited. Additionally, rutile growth can be promoted by varying physical vapor deposition (PVD) parameters for the deposition of an electrode on which the titanium oxide is to be deposited. In some embodiments, rutile growth can be promoted by depositing titanium oxide on a platinum electrode and increasing the pedestal temperature and the oxygen partial pressure of the working gas during deposition of the electrode.

I. Memory Cells
A. High-K Dielectrics

A capacitor can be used to store a bit of memory. For example, dynamic random access memory (DRAM) cells include a metal-insulator-metal (MIM) capacitor that can have a different value (e.g., 0 or 1) depending on the amount of charge stored. As DRAM arrays become smaller and smaller, a need has arisen for high-K dielectrics that can be used with DRAM capacitors. Higher-K materials can store more charge in a smaller volume, and therefore are desirable for reducing memory cell size.

Titanium Oxide ($TiO_2$) is one high-K material. Titanium oxide can have multiple crystal phases which have different dielectric constants. Two known crystal phases of titanium oxide are anatase and rutile. Anatase is relatively lower-K (K~40), while rutile has a much higher dielectric constant (K~90). It is therefore desirable to promote the formation of rutile, even in films that may also contain anatase, to increase the dielectric constant of deposited films and therefore the ability to use smaller features in semiconductor devices.

B. Process for Increasing Dielectric Constant of Deposited Metal Oxides

Figure 1:
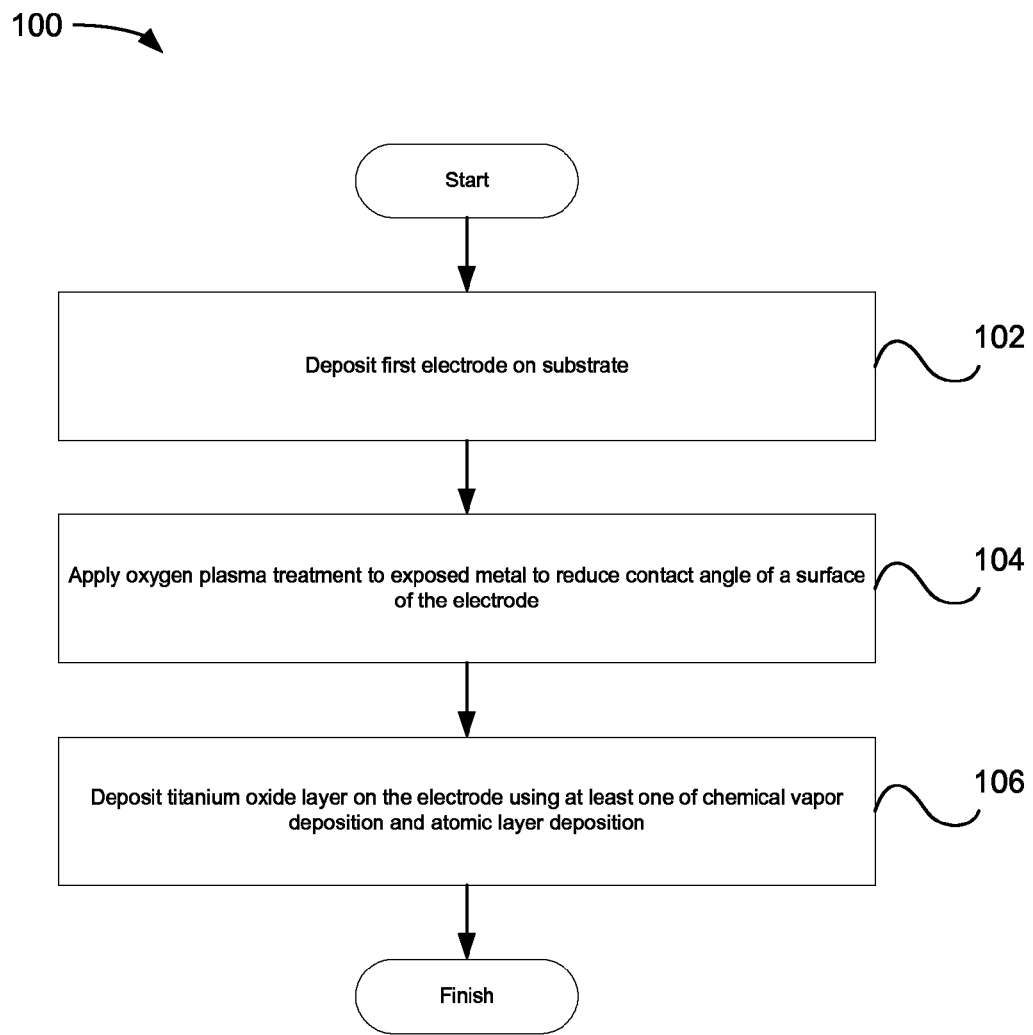
FIG. 1 is a flowchart illustrating a process for increasing a dielectric constant of a dielectric layer used for semiconductor memory.

FIG. 1 is a flowchart illustrating a process 100 for increasing a dielectric constant of a dielectric layer used for semiconductor memory. For example, the dielectric layer can be used in a metal-insulator-metal (MIM) capacitor that is part of a semiconductor memory cell such as dynamic random access memory (DRAM) (see e.g. FIG. 2).

In operation 102, a first electrode is deposited on a substrate. The electrode can be, for example, noble or near-noble metal such as platinum or ruthenium. In other embodiments, the electrode can be a metal or compound having a relatively high work function (e.g. greater than 5 eV). Such materials are used for semiconductor memories because of their advantageous electrical characteristics. For example, platinum has a high work function (~5.65 electron volts), which can reduce leakage in capacitors, which in turn reduces the refresh rate of a memory using the capacitors. In some embodiments, PVD process conditions for depositing the first electrode can be changed to increase the amount of rutile in a titanium oxide layer deposited on the first electrode.

In operation 104, an oxygen plasma treatment is applied to the first electrode to reduce the contact angle of the surface of the electrode. As is explained further in the discussion of FIG. 5A, oxygen plasma can be use to reduce the contact angle of typically hydrophobic noble metals such as platinum, which can therefore be used to increase adsorption of precursors used to deposit metal oxides thereon. Additionally, as will be explained regarding FIG. 5C, the plasma treatment changes the surface energy of the electrode thereby promoting the growth of rutile titanium oxide on the treated electrode, and increasing the dielectric constant of a titanium oxide layer deposited on the first electrode.

In operation 106, a titanium oxide layer is deposited on the first electrode using at least one of chemical vapor deposition (CVD) and atomic layer deposition (ALD). CVD and ALD are vapor-based deposition techniques that use precursors to react with an oxidant in the gas mixture or on electrode surface to form a layer of material (e.g. a titanium oxide layer). In further operations, a capacitor can be formed by forming an additional electrode over the titanium oxide layer.

C. Memory Cell Structure

Figure 2:
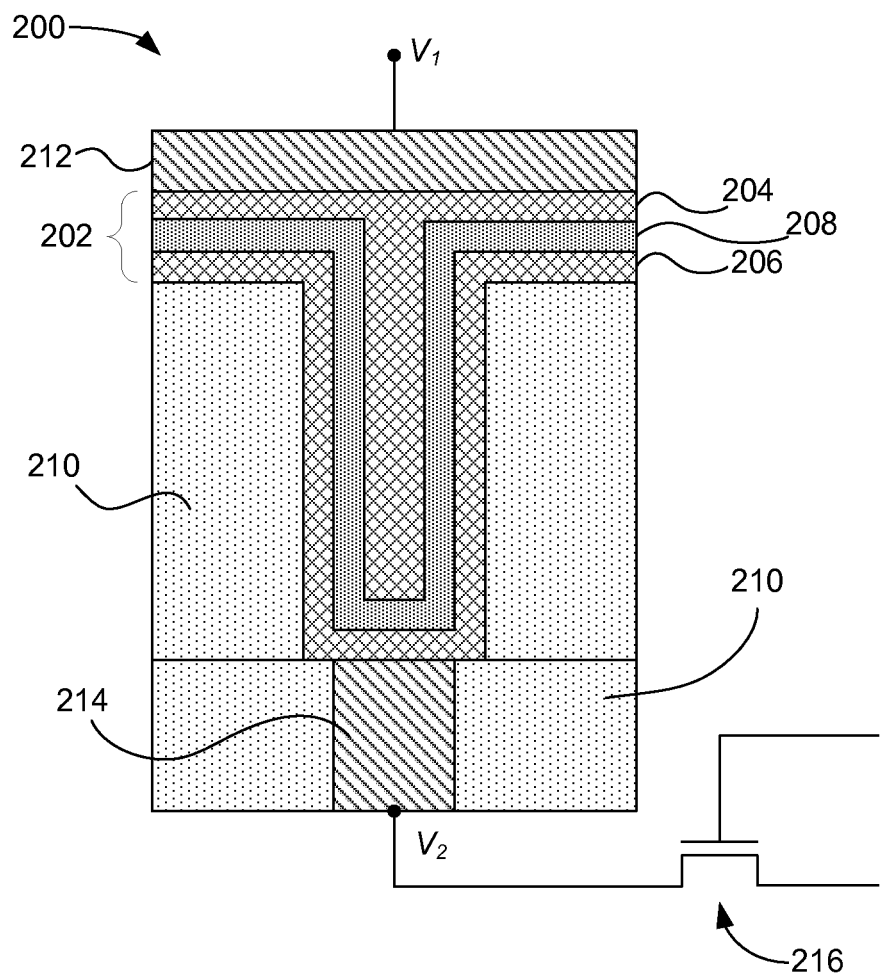
FIG. 2 illustrates a memory cell including a capacitor having a metal-insulator-metal (MIM) structure.

FIG. 2 illustrates a memory cell 200 including a capacitor having a metal-insulator-metal (MIM) structure. The memory cell 200 is one of several possible configurations that can be formed utilizing the high-K dielectrics described herein. The memory cell 200 includes a capacitor 202 having an MIM structure, although other layers (e.g., multiple insulating or metal layers) can be included. For example, the capacitor 202 may be a metal-insulator-insulator-metal (MIIM) or a metal-insulator-metal-insulator-metal (MIMIM) structure.

The capacitor 202 includes two conductive electrodes 204 and 206, and an insulating layer 208 (a dielectric). The electrodes 204 and 206 can be noble, near-noble or non-noble metals (for example platinum or ruthenium) that, for example, have a high work function thus promote lower leakage, and the insulating layer 208 is a high-K dielectric such as titanium oxide or doped titanium oxide. In other embodiments, the electrodes can be any material that is hydrophobic or that inhibits the formation of oxides thereon. The capacitor 202 is surrounded by interlayer dielectrics (ILDs) 210 that can be insulating materials such as silicon dioxide, silicon nitride, or low-K dielectrics. The capacitor 202 is shown having a cylinder structure, although other capacitor configurations such as pedestal/pillar structures or crown structures can also be used.

The capacitor is connected to contacts 212 and 214, which can be used to apply voltage across the MIM 202 to maintain charge on the memory cell 200 and to change the memory state of the cell 200. The contact 214 is attached to a memory cell transistor 216 which can be used to select the memory cell 200 for read/write access. It is understood that the cell 200 is an example of memory cells that could be used with the high-K dielectrics described herein, and that other structures and configurations can also be used.

II. Electrode Processing and High-K Dielectric Deposition

A. Electrode Processing and Device Formation

Figure 3A:
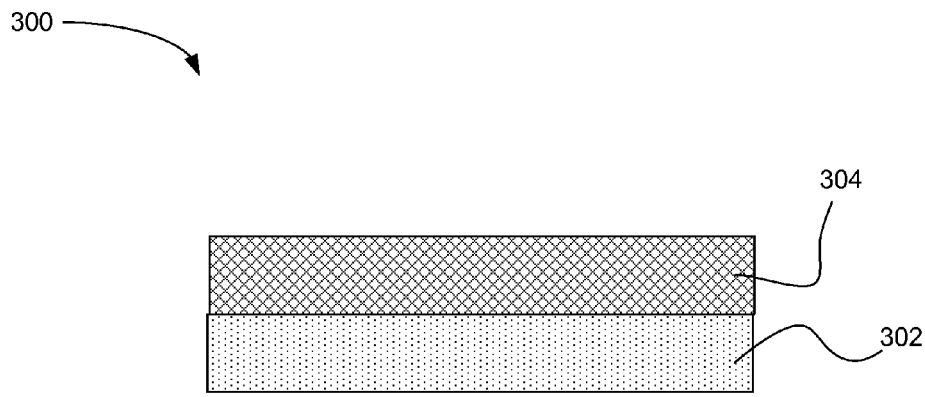
FIGS. 3A-3D illustrate the formation of an MIM capacitor using techniques to increase the dielectric constant of an insulating layer.

FIGS. 3A-3D illustrate the formation of an MIM capacitor using techniques to increase the dielectric constant of a titanium oxide layer. FIG. 4 is a flowchart describing a process 400 for forming a capacitor 300.

In operation 402, a substrate 302 is provided. The substrate may be any appropriate substrate, such as a silicon-based substrate, and may include conductive portions such as interconnects (bit lines, word lines) or contact plugs such as those shown in FIG. 2. For example, the substrate 302 may include interlayer dielectrics 210 and a contact 214.

In operation 404, a first electrode 304 is deposited on the substrate 302. The first electrode 304 may be a noble, near-noble, or non-noble material, for example platinum or ruthenium, and can be deposited using any appropriate technique, such as CVD, ALD, or PVD. In some embodiments, (see operation 405), the first electrode 304 can be platinum deposited using certain PVD processing parameters so that a desired texture of the electrode is achieved (see FIGS. 6A and 6B) to increase the amount of rutile deposited on the first electrode. In other embodiments, the first electrode 304 may be any conductive material that is hydrophobic and inhibits the formation of oxides thereon. FIG. 3A illustrates the first electrode 304 deposited on the substrate 302. The first electrode 304 may be, for example, the electrode 206 of the memory cell 200.

In operation 405, when the electrode 304 is deposited, the electrode 304 can be optionally textured to promote the growth of rutile titanium oxide insulator on the electrode 304. Rutile titanium oxide is desirable because it has a high dielectric constant (K~90) relative to the anatase crystal phase of titanium oxide (K~40). It can also be desirable to increase the proportion of rutile titanium oxide compared to anatase.

Rutile has a tetragonal crystal structure whose growth can be encouraged by using vapor-based deposition techniques (e.g. ALD, CVD) to deposit titanium oxide on electrodes having similar crystal structures or similar lattice parameters at their interface. As is described in more detail in the discussion regarding FIGS. 6A and 6B, a platinum electrode having a [111] orientation may provide a good template for rutile titanium oxide. In some embodiments, the [111] platinum orientation can be encouraged by varying certain PVD processing parameters, such as working gas mixture and pedestal temperature. For example, in order to deposit platinum having a [111] orientation, a deposition process using a working gas mixture having an oxygen partial pressure of greater than 10 percent at pedestal temperature of 300° C. can be used.

Figure 3B:
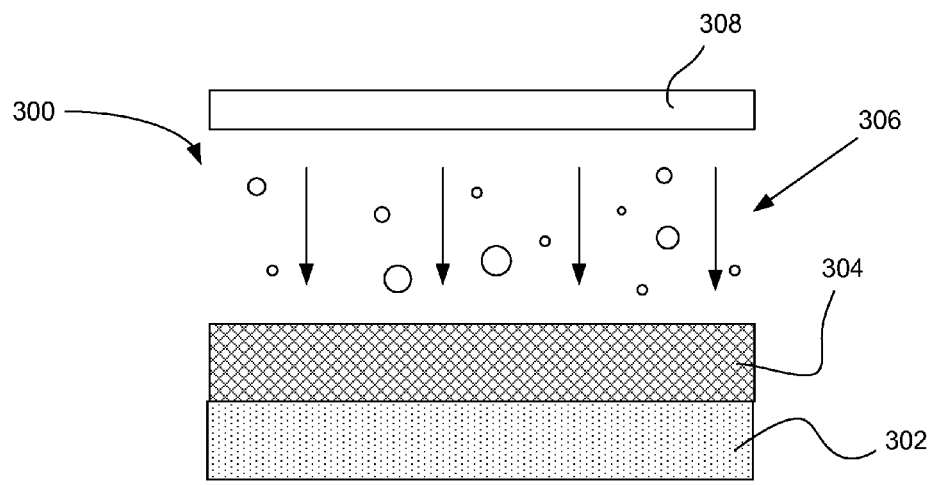
Figure 4:
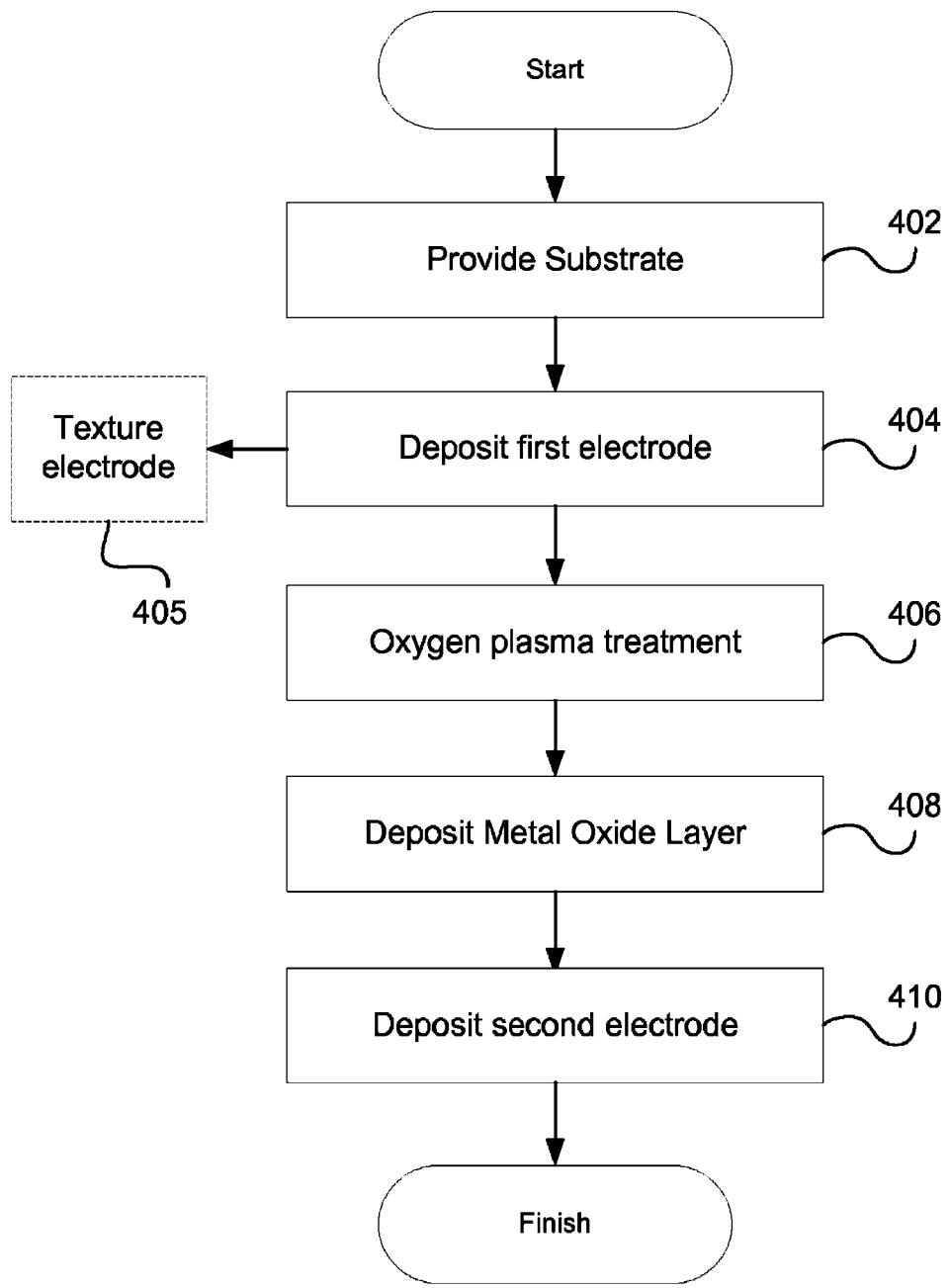
FIG. 4 is a flowchart describing a process for forming a capacitor.

In operation 406, the first electrode 304 is treated using an oxygen plasma treatment 306, which is shown in FIG. 3B. The plasma treatment 306 can be applied using a plasma applicator 308 such as a high-vacuum plasma system or an atmospheric plasma application. Any type of plasma treatment can be used to improve ALD or CVD nucleation. For example, samples were prepared using both high-density radio frequency (RF)-based plasma (using a preclean chamber of a PVD tool) and atmospheric plasmas (using a handheld plasma application tool). The high-density plasma could be formed from oxygen or oxygen and another gas, with powers from 500 W to 10 kW, and pressures from 10-15 mTorr, for example. These two plasma applications span the range from high-quality to low-quality applications, but still produce high-K metal oxide layers. This indicates that the important quality of the plasma is that the oxygen radical species change the nature of the surface of the electrode and change the surface energy regardless of the method of plasma application. It is believed that this modification promotes the growth of rutile titanium oxide.

Figure 3C:
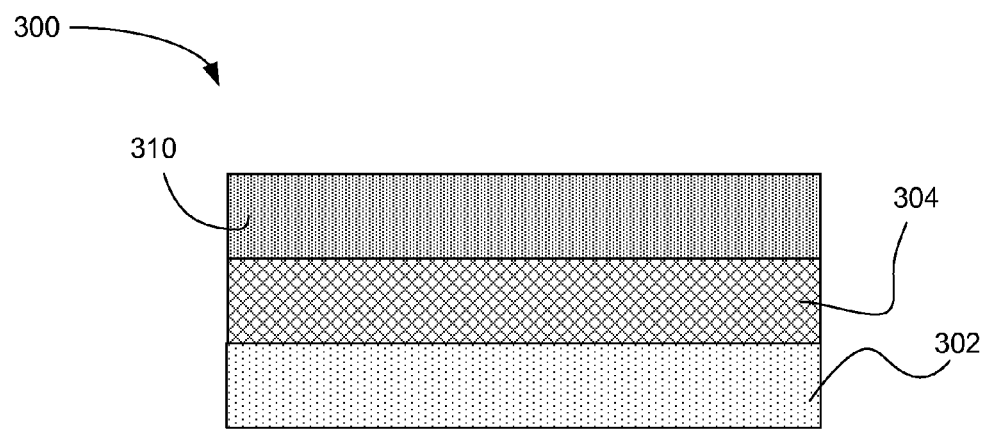

In operation 408, a titanium oxide layer 310 is deposited over the first electrode 304, which is shown in FIG. 3C. The titanium oxide layer 310 can also be doped with another insulating layer, for example to form a yttrium doped titanium oxide layer or an aluminum doped titanium oxide layer. In some examples, yttrium oxide concentrations can be from 1-5 atomic percent and aluminum oxide concentrations can be from 1-20 atomic percent.

The titanium oxide layer 310 can be deposited using either CVD or ALD, and can be deposited from precursors such as Titanium Tetraisopropoxide (TTIP), Tetrakis Dimethylamino Titanium (TDMAT), Tetrakis Diethylamido Titanium (TDEAT), or tetrakis-ethylmethyl-amido titanium (TEMAT). With ALD depositions, the oxidizing reagent can be ozone, water vapor, or oxygen. The thickness of the layer can be any desired thickness, for example from 10-1000 Å.

The plasma treatment of the first electrode 304 helps to promote the growth of rutile titanium oxide, which has higher dielectric constant than anatase. The plasma treatment promotes the deposition of a smoother oxide layer. It is also believed that the plasma treatment changes the surface energy of the electrode 304, which encourages the growth of rutile. As is described in the discussion regarding FIG. 5C, the oxygen plasma treatment can help suppress the formation of anatase and promote the formation of rutile.

Figure 3D:
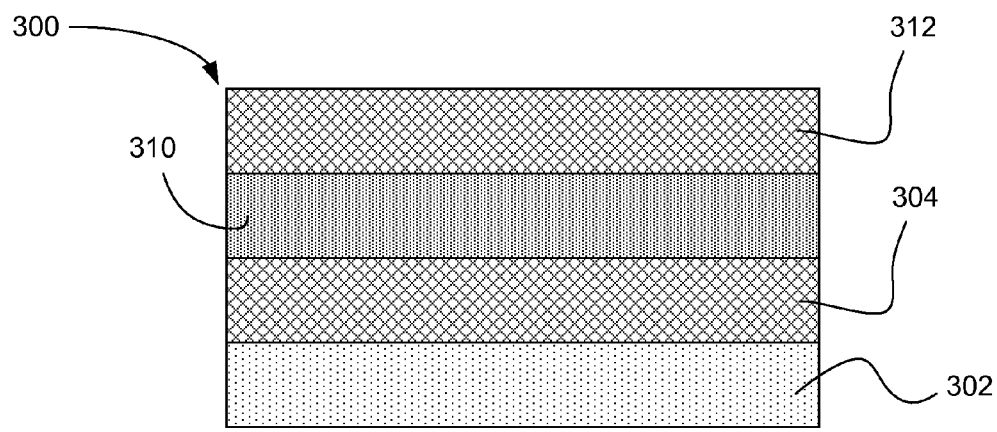

In operation 410, a second electrode 312 (e.g. the electrode 204) is deposited, and the capacitor formation is completed. After the second electrode is deposited, other layers, such as the contact 212 can be deposited thereon. FIG. 3D illustrates the completed capacitor 300.

In some embodiments, the titanium oxide layer can be thermally treated, for example by annealing, either before or after the second electrode 312 is deposited. For example, the titanium oxide layer can be annealed using a rapid thermal oxidation (RTO) of approximately 600° C. or greater. The thermal treatment, it is believed, can cause or enhance the formation of rutile in the titanium oxide layer.

B. Experimental and Sample Data

Figure 5A:
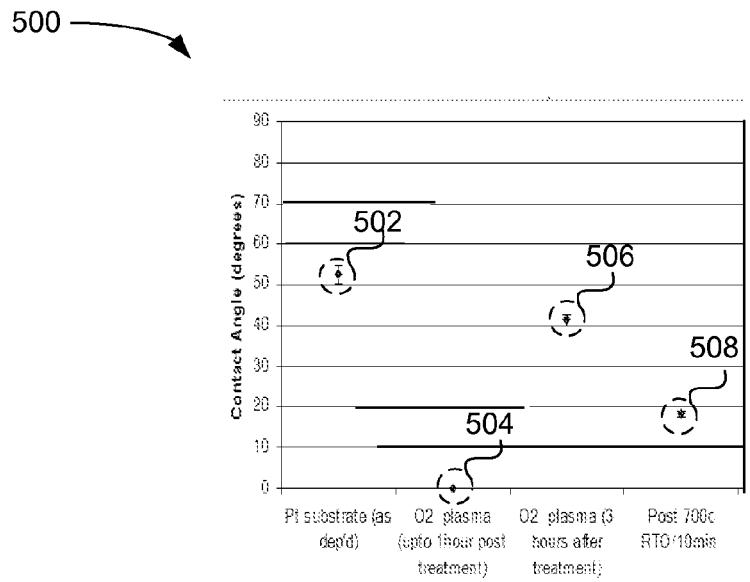
FIG. 5A illustrates the reduction of the contact angle of a platinum electrode when subjected to oxygen plasma treatment.

FIG. 5A illustrates the reduction of the contact angle of a platinum electrode when subjected to oxygen plasma treatment. As shown in the graph 500, the platinum substrate as deposited, before treatment 502, has a contact angle of at least 50°, indicating a hydrophobic surface that may inhibit ALD nucleation. After a one hour oxygen plasma treatment 504, the contact angle drops to approximately 0°, indicating an extremely hydrophilic surface that promotes ALD nucleation. Three hours following the completion of the treatment, although the contact angle increases 506, it is still lower than that as deposited Pt, which can, for ALD process, significantly reduce nucleation delay (see FIG. 5B).

Rapid thermal oxidation (RTO) is another treatment that can be used to lower the contact angle of electrodes. For example, a bare platinum electrode surface was optimized post RTO at 700° C. for ten minutes 508, lowering the contact angle to below 20°. However, the plasma treatment 504 reduces the contact angle much further, and therefore better promotes nucleation of ALD precursors.

Figure 5B:
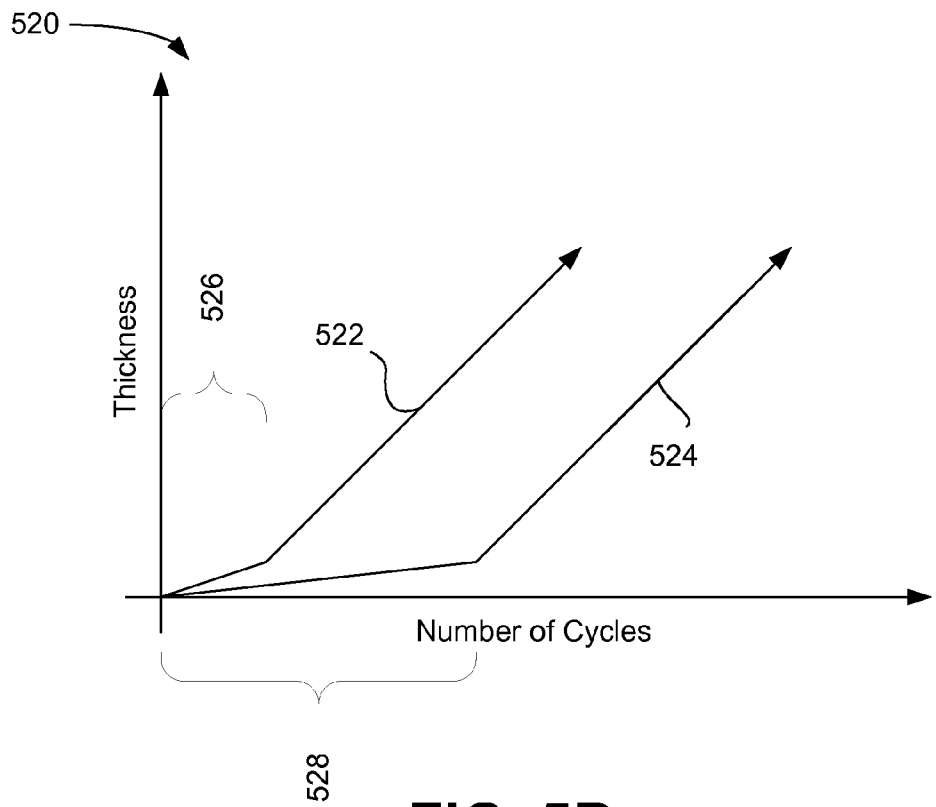
FIG. 5B is a graph that illustrates the growth of ALD layers deposited on platinum.

As-deposited platinum and other noble metals hinder ALD nucleation, which can lead to a nucleation delay. FIG. 5B is a graph that illustrates the growth of ALD layers deposited on platinum. The graph 520 plots thickness as a function of a number of ALD cycles. A plot 522 illustrates the theoretical growth of a metal oxide layer deposited on platinum that has been treated using oxygen plasma, and a plot 524 illustrates the theoretical growth of a metal oxide layer deposited on platinum that has not been so treated. The nucleation delay 526 of the plot 522 and the nucleation delay 528 of the plot 524 are periods of time over which layer growth is retarded because of poor nucleation on the platinum surface. Typically, the first cycles of deposition for untreated platinum or ruthenium substrates can suffer from the reduction in deposition rate as precursors may not adsorb to the platinum surface as readily as they do to already deposited layers of metal oxide since the already-deposited layers are more receptive to ALD nucleation.

As can be seen, in theory the nucleation delay 526 is much shorter than the nucleation delay 528, illustrating another potential benefit of the oxygen plasma treatment. Additionally, since in theory fewer cycles are required to deposit the layer, less precursor is used, which reduces waste and therefore costs. In some embodiments, the nucleation delay 526 can be eliminated or almost eliminated.

Figure 5C:
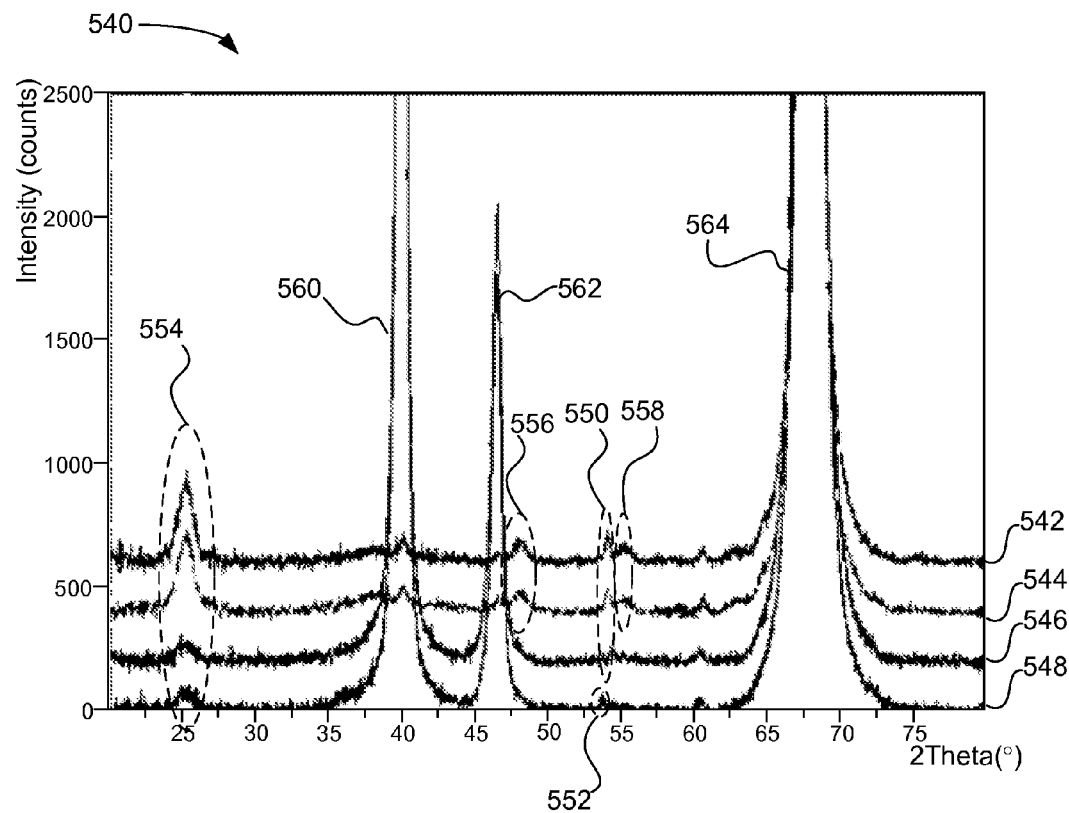
FIG. 5C is an X-Ray Diffraction (XRD) graph illustrating the deposition of titanium oxide on platinum electrodes using oxygen plasma treatments discussed herein.

FIG. 5C is an X-Ray Diffraction (XRD) graph 540 illustrating the titanium oxide layer deposited on platinum electrode using oxygen plasma treatments discussed herein. XRD can be used to determine the existence of different crystal phases in a sample. Each crystallized structure has its signature X-ray diffraction angles—for example, platinum crystal shows a peak at approximately 67.5° for its (220) planes' diffraction if copper is used as the X-ray source.

Plots 542 and 546 represent titanium oxide layers deposited on oxygen plasma treated platinum bottom electrodes. The titanium oxide layers were deposited using ALD with a titanium tetraisopropoxide (TTIP) precursor. The plot 542 represents a sample that has been thermally treated (using rapid thermal anneal with $O_2$ (RTO)) at 700° C. for 10 minutes after the deposition of the titanium oxide layer, and plot 546 represents a sample that has not been thermally treated. Plots 544 and 548 represent samples that were deposited without treating the platinum electrode; plot 544 represents a sample that was thermally oxidized, and plot 548 represents a sample that was not thermally oxidized.

The plasma-treated samples 542 and 546 and the thermally oxidized but untreated sample 544 show rutile (211) peaks 550 at 54.3°. The rutile peak from plasma-treated sample 542 is stronger than the rutile peak from untreated sample 544. The untreated sample 548 shows no rutile peak, and shows an anatase (105) peak 552 at 53.9°. Therefore, the plasma treatment of the platinum appears to increase the amount of rutile in the titanium oxide layer.

All samples show anatase (101) peaks 554 at 25.3°, the intensity which increases with thermal oxidation and which is unaffected by plasma treatment. Additionally, anatase (200) peaks 556 at 48.1° are present in the thermally oxidized samples 542 and 544, but are unaffected by plasma treatment. Other peaks shown in FIG. 5C include platinum (111) peaks 560 at 39.8°, platinum (200) peaks 562 at 46.2°, and platinum (220) peaks 564 at 67.5°.

Plasma treatment of platinum electrodes thereby promotes the growth of rutile titanium dioxide. Samples that were formed without plasma treatment showed substantially no rutile formation. Additionally, the dielectric constant of the titanium dioxide layer may increase from approximately 40 to 50-60. Additionally, although data for platinum is shown here, oxygen plasma treatment should encourage the growth of rutile on other noble, near-noble, or non-noble electrodes such as ruthenium.

III. Electrode Texturing

Depositing titanium oxide on untreated platinum typically results in the deposition of relatively low-K anatase. Described below are techniques for promoting the deposition of rutile by altering process conditions for PVD platinum deposition to change the texture (crystal orientation) of the platinum electrode. Depositing a textured platinum electrode having lattice parameters in the surface plane that match the lattice parameters of rutile titanium oxide can promote the growth of rutile titanium oxide and increase the K-value of the deposited dielectric. In this way, the platinum electrode can be used as a template. A platinum electrode having strong [111] crystal orientation can be used as a template for rutile deposition. As is described further below, the [111] orientation can be encouraged by using a high pedestal temperature (i.e. greater than 250° C.) and a working gas with a high oxygen partial pressure (e.g. greater than 10 percent). The working gas can include, for example, argon (or another inert gas) and oxygen.

Figure 6A:
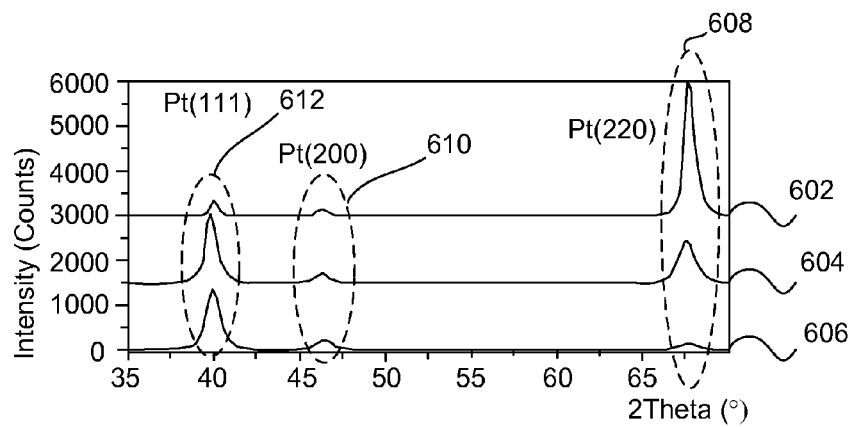
FIG. 6A is an XRD graph showing the crystal orientations of films deposited using certain PVD conditions.
Figure 6B:
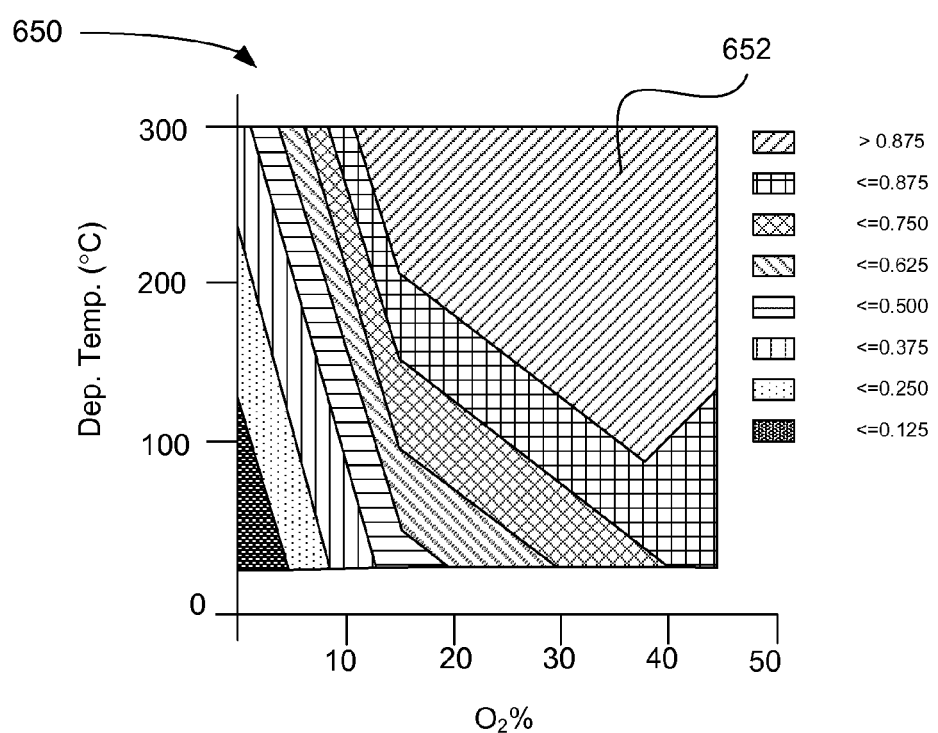
FIG. 6B is a contour plot showing that the XRD peak height ratio between rutile (211) and anatase (211) increases when titanium dioxide is deposited on a platinum electrode deposited with a higher oxygen ($O_2$) partial pressure in the working gas and with a higher pedestal temperature. These conditions also give platinum with a [111] orientation.

FIG. 6A is an XRD graph showing the crystal orientations of films deposited using certain PVD conditions. FIG. 6B is a contour plot showing that the proportion of rutile to anatase increases when titanium oxide is deposited on an electrode that was deposited using PVD with a higher oxygen ($O_2$) partial pressure in the working gas and with a higher pedestal temperature. These conditions also give platinum with a [111] orientation. In addition, texturing can be combined with plasma treatments, described above, to further increase the film's dielectric constant.

Various parameters of the PVD deposition of platinum can be used to texture the electrode: changing the pedestal temperature and changing the mixture of the working gas have been shown to affect platinum texture. The plots 602-606 of FIG. 6A show the XRD plots of platinum electrodes deposited using varying conditions. The plot 602 represents a platinum sample deposited at high pedestal temperature (250-300° C., for example) in an argon/oxygen working gas mixture. The plot 604 represents a platinum sample deposited with a pedestal temperature of approximately 20° C. and an argon/oxygen working gas. The plot 606 represents a platinum sample that is deposited using a high pedestal temperature (250-300° C.) and a working gas having a high oxygen partial pressure, for example greater than 10%. Sputtering power was also investigated as a variable for altering the platinum texture, but was shown to have a minor effect on texture. The plots 602 and 604 were deposited at 50 watts of power.

The [220] orientation is indicated by the peaks 608 at 67.5°, the [200] orientation is indicated by the peaks at 46.2°, and the [111] orientation of platinum is indicated by the peaks 612 at 39.8°. High oxygen partial pressure and high pedestal temperature (e.g., greater than 10% and greater than 250° C.) encourage formation of the [111] orientation as indicated by the peaks 612. The sample represented by the plot 606 has a strong (111) peak and a weak (220) peak, versus the sample represented by the plot 604, which has both a strong (220) peak and a strong (111) peak. The sample represented by the plot 606 therefore has a higher proportion of [111] platinum. When titanium oxide was deposited on the samples represented by the plots 604 and 606, using TTIP and ozone as ALD reagents, and using a 600° C. RTO, a rutile (211) peak was found on the sample represented by the plot 606. Therefore, rutile [211] has been shown to form on platinum deposited using PVD with oxygen partial pressures exceeding 10% and pedestal temperatures exceeding 250° C. Further, as is shown in FIG. 6B, rutile is more likely to form under these conditions.

FIG. 6B is a contour plot 650 showing the XRD peak ratio between rutile (211) and anatase (211) in a sample as a function of PVD working gas oxygen partial pressure and pedestal temperature. The section 652 corresponds to higher deposition temperatures and higher oxygen partial pressures that result in a rutile (211) to anatase (211) ratio of greater than 0.875. Therefore, increasing the pedestal temperature and increasing the oxygen partial pressure of the working gas have been shown to increase the amount of rutile deposited. For example, a pedestal temperature of greater than 200° C. and an oxygen partial pressure of more than 10% can produce desirable amounts of rutile. Alternatively, higher temperatures (e.g., 250° C., or 300° C.) or higher oxygen partial pressures (e.g. 15%, 20%, 30%, 40% or greater) increase the likelihood of the deposition of rutile on the platinum electrode.

In some embodiments, for example, the pedestal temperature can be greater than 200° C., greater than 250° C., greater than 300° C., between 200 and 300° C., between 250 and 300° C., between 250 and 400° C., etc. In some embodiments, for example, the working gas for the PVD process can include oxygen (e.g. can be an argon/oxygen mixture), and the oxygen partial pressure can be greater than 10%, greater than 15%, greater than 20%, greater than 30%, greater than 40%, between 10% and 20%, between 10% and 15%, between 15% and 20%, between 15% and 30%, etc.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a stack comprising:
   depositing a platinum electrode on a substrate;
   applying an oxygen plasma treatment to the platinum electrode; and
   depositing a titanium oxide layer on the platinum electrode using at least one of a chemical vapor deposition process and an atomic layer deposition process, wherein the titanium oxide layer comprises at least a portion rutile titanium oxide; and
   annealing the stack using a rapid thermal oxidation (RTO) process of at least approximately 600° C.

2. The method for forming a stack according to claim 1, wherein applying the oxygen plasma comprises using one of a high density plasma and an atmospheric plasma.

3. The method for forming a stack according to claim 1, wherein the titanium oxide layer has an X-Ray Diffraction peak associated with rutile titanium oxide.

4. The method for forming a stack according to claim 1, wherein depositing the platinum electrode comprises depositing platinum using physical vapor deposition (PVD) with a pedestal temperature greater than 250° Celsius.

5. The method for forming a stack according to claim 4, further comprising depositing the platinum electrode using PVD with a working gas having an oxygen partial pressure of greater than 10 percent.

6. The method for forming a stack according to claim 1, wherein depositing the platinum electrode comprises depositing a platinum electrode having a [111] crystal orientation.

7. The method for forming a stack according to claim 1, further comprising depositing a second electrode over the titanium oxide layer to form a capacitor.

8. The method for forming a stack according to claim 7, wherein the capacitor is part of a dynamic random access memory (DRAM) cell.

9. A method for forming a capacitor comprising:
depositing a platinum electrode on a substrate using physical vapor deposition (PVD) with a pedestal temperature of greater than 250° C. and a working gas having an oxygen partial pressure of greater than 10 percent;
treating the electrode using an oxygen plasma; and
depositing a titanium oxide layer on the electrode, wherein the titanium oxide layer is at least a portion rutile titanium oxide;
doping the titanium oxide layer with at least one of yttrium and aluminum.

10. The method for forming a capacitor according to claim 9, further comprising annealing the capacitor using a rapid thermal oxidation (RTO) process of at least approximately 600° C.

11. The method for forming a capacitor according to claim 9, further comprising:
depositing a second electrode over the metal oxide layer, wherein the second electrode is one of platinum and ruthenium, to form a capacitor structure.

12. The method for forming a capacitor according to claim 11, wherein the capacitor structure comprises a dynamic random access memory (DRAM) cell.

13. The method for forming a capacitor according to claim 9, wherein treating comprises using one of a high density plasma and an atmospheric plasma.

14. The method for forming a capacitor according to claim 9, wherein the titanium oxide layer includes an X-ray diffraction peak associated with rutile titanium oxide.

15. The method for forming a capacitor according to claim 10, wherein the pedestal temperature is between 250° and 300° C.

16. The method for forming a capacitor according to claim 10, wherein the pedestal temperature is approximately 300° C.

17. The method for forming a capacitor according to claim 10, wherein the oxygen partial pressure is greater than 20 percent.

* * * * *